United States Patent [19]

Mattfeld et al.

[11] 3,753,137

[45] Aug. 14, 1973

[54] AMPLIFIER

[75] Inventors: Johann Mattfeld, Kirchhausen; Frank Pieper, Schwaigern, both of Germany

[73] Assignee: Licentia, Patent-Verwaltungs G.m.b.H., Frankfurt am Main, Germany

[22] Filed: Mar. 12, 1971

[21] Appl. No.: 123,769

[30] Foreign Application Priority Data

Mar. 23, 1970 Germany.................. P 20 12 829.8

[52] U.S. Cl......................... 330/15, 330/24, 330/17, 330/20, 330/22, 330/30 D

[51] Int. Cl............................................. H03f 3/26

[58] Field of Search.................. 330/13, 23 C, 24 C, 330/15 C

[56] References Cited

UNITED STATES PATENTS 3,480,835 11/1969 Richman.............................. 317/41

3,500,218 3/1970 Burwen............................ 330/13 X 3,486,124 12/1969 Eisenberg............................ 330/13

3,512,097 5/1970 Tyler................................ 330/13 X

*Primary Examiner*—Nathan Kaufman

*Attorney*—Spencer & Kaye

[57] ABSTRACT

An amplifier comprises a class-B push-pull transistor output stage controlled by a driver transistor, means for maintaining the quiescent collector current of the output stage transistors independent of temperature fluctuations in the output stage transistors, the load resistance of the driver transistor being provided by the collector-emitter path of an additional transistor. A constant current supply is connected to the base of the additional transistor such that its collector-emitter voltage and thus the load resistance of the driver transistor varies substantially in proportion to the voltage of the supply source whereby the quiescent collector current in the transistors of the output stage is independent of fluctuations in the supply voltage.

9 Claims, 2 Drawing Figures

Inventors.
Johann Mattfeld
Frank Pieper

BY Spencer & Kaye
ATTORNEYS.

AMPLIFIER

BACKGROUND OF THE INVENTION

The invention relates to an amplifier having class-B push-pull output stage and a driver to control the output stage.

The transistors of an output stage in a class-B push-pull amplifier are operated with a very low quiescent collector current. This quiescent collector current must be maintained constant in order to avoid distortion of the output signal, particularly in order to avoid so-called transfer distortion or class-B distortion. Care must therefore be taken to ensure that the quiescent collector current is independent of temperature fluctuations and of variations in the supply voltage.

SUMMARY OF THE INVENTION

It is the object of the present invention to provide a circuit wherein the quiescent collector current in the transistors of an output stage in a class-B push-pull amplifier can be maintained independent of fluctuations in the voltage source (e.g., a battery) and of temperature fluctuations. It is a further object of the present invention to provide a circuit which can be integrated in a semiconductor body common to all the components, without difficulty.

According to the invention, there is provided an amplifier comprising a voltage source, a driver stage including, a first transistor, a class-B push-pull output stage including second and third output transistors, means for maintaining the quiescent collector current of said second and third transistors independent of temperature fluctuations in said second and third transistors, a fourth transistor whose collector-emitter path forms a load resistance for said first transistor connected in series with the collector-emitter path of said first transistor, and a constant current source for controlling the base electrode of said fourth transistor so that the collector-emitter voltage of said fourth transistor and hence said load resistance of said first transistor varies substantially in proportion to the voltage of said voltage source.

BRIEF DESCRIPTION OF THE DRAWINGS

The invention will now be described in greater detail, by way of example, with reference to the accompanying drawings, in which.

DESCRIPTION OF THE PREFERRED EMBODIMENTS

Figure 1:
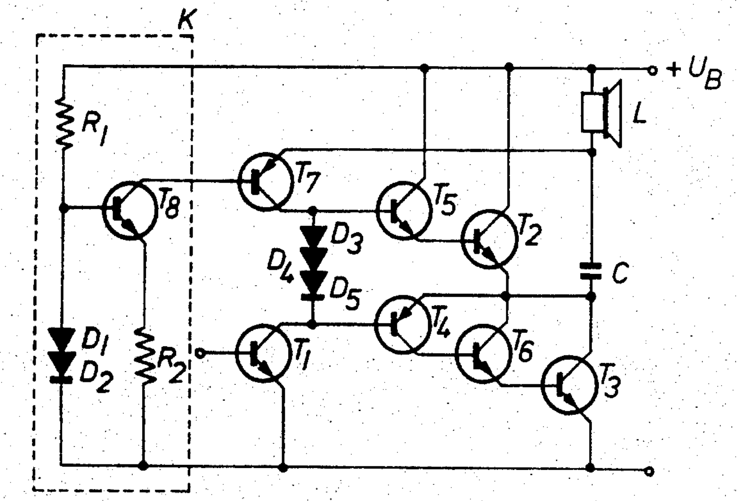
FIG. 1 is a circuit diagram of a first embodiment of the invention.

Basically, the invention includes an amplifier having a class-B push-pull output stage controlled by a driver in which means are provided for maintaining the quiescent collector current independent of fluctuations of temperature in the output stage transistors and in which the load resistance, connected in series with the collector emitter path of the driver transistor $T_1$, consists of the collector-emitter path of an additional transistor $T_7$, the base electrode of which is controlled through a constant-current source K, so that the load resistance of the drive transistor $T_1$ varies in proportion to the collector-emitter voltage of the additional transistor and hence substantially in proportion to the supply voltage.

In known push-pull circuits, an ohmic resistor, which is connected to the supply voltage, is connected into the collector lead of the drive transistor. The consequency of this is that, on a variation in the supply voltage, the collector current through the driver transistor likewise changes. In these known circuits, at least one diode, the voltage drop of which is used to control the output-stage transistors, is connected in the forward direction, in series with the collector resistor of the driver transistor. If the battery voltage alters considerably in this circuit, however, an alteration in the quiescent collector current in the output-stage transistors caused by the changed forward voltage of the diode, cannot be avoided.

The circuit according to the invention no longer has this disadvantage. In the circuit according to the invention, the direct collector current of the driver transistor is also maintained constant regardless of the supply voltage. The present class-B push-pull amplifier can also be very easily constructed by the integrated solid-state circuit technique. In this case, in an advantageous further development of the proposed circuit, provision is made for the two output-stage transistors $T_2$ and $T_3$ to consist of transistors having the same sequency of regions. In this case, however, a complementary transistor $T_4$ must precede one of the two output-stage transistors in order to provide a phase reversal. In order to facilitate the integration of the circuit, for example in a silicon semiconductor body common to all the components, the output-stage transistors would be of the n-p-n type of conductivity, while the complementary transistor is a p-n-p lateral transistor. The lateral transistor is a surface transistor wherein the emitter region and the collector region are mounted side by side at one surface in a basic base member. The current amplification of these transistors is very low and generally has the value $B \approx 1$.

In order to render control of the output stage possible with very low currents and in order to reduce the power dissipation in the driver stage, a further transistor $T_5$ and $T_6$ with a common-emitter connection is advantageously connected between the driver transistor $T_1$ and each of the transistors $T_2$ and $T_3$ of the output stage, for the current amplification.

The constant-current source preferably consists of a transistor $T_8$, which is operated with a common-emitter connection and has its collector electrode connected to the base electrode of the additional transistor $T_7$. The base bias of this transistor $T_8$ is determined by the constant voltage drop at diodes, $D_1$ and $D_2$, loaded in the forward direction.

The two examples shown in the drawings will now be described in greater detail:

Simple class-B push-pull output stages can be produced with complementary output-stage transistors. Since the current amplification of complementary transistors produced in the integrated technique would differ very greatly from one another, however, a practical alternative solution must be found. According to FIG. 1, this is effected by the fact that the two output-stage transistors $T_2$ and $T_3$ are transistors having the same sequence of regions and their collector-emitter paths are connected in series. One of these output-stage transistors ($T_3$) is preceded by a complementary transistor $T_4$, th current amplification B of which is substantially equal to 1. The lateral transistor, which can easily be produced in the integrated technique, is suitable for this purpose. By this means, output-stage transistors having the same current amplification are obtained, because the current amplification of the transistors $T_2$ and $T_3$ is equal, and the combination of the transistors $T_3$ and $T_4$ acts like a complementary transistor to $T_2$ with the current amplification corresponding to the transistor $T_2$.

The emitter electrode of the lateral transistor $T_4$ is connected to the collector electrode of the transistor $T_3$, while the base electrode of the lateral transistor derives the signal voltage from the collector electrode of the driver transistor $T_1$. In order to be able to operate the output-stage transistors with very low control currents, the two output-stage transistors may advantageously each be preceded by a transistor $T_6$ or $T_5$ respectively with a common-emitter connection for the current amplification. Thus the collector of the lateral transistor $T_4$ leads directly to the base of the amplifying transistor $T_6$ for example, the emitter electrode of which is in turn connected to the base electrode of the following output-stage transistor $T_3$. In the same manner, the other output stage transistor $T_2$ is preceded by an amplifying transistor $T_5$. Since the transistors $T_2$, $T_3$, $T_5$ and $T_6$ are preferably n-p-n transistors, the collector electrode of the transistor $T_2$ is connected directly, and the collector electrode of the transistor $T_5$ is connected directly or through a collector resistor, to the positive pole of the supply voltage ($U_B$), while the collector electrodes of the transistors $T_3$ and $T_6$ are connected, through an isolating capacitor C and the load resistance, for example a loudspeaker, likewise to the positive pole of the source of supply voltage.

Connected into the collector lead of the driver transistor $T_1$ is the collector-emitter path of an additional transistor $T_7$. The collector of the additional transistor $T_7$ is connected to the collector of the driver transistor through diodes $D_3$, $D_4$ and $D_5$ poled in the forward direction. The diodes $D_3$ – $D_5$ and the base-emitter paths of the transistors $T_5$, $T_2$ and $T_4$ thus form a closed circuit. The diodes $D_3$ to $D_5$ are selected so that the temperature behaviour of one diode at a time corresponds as precisely as possible to the temperature behaviour of the base-emitter path of one transistor. Temperature fluctuations are compensated by this means.

The base electrode of the additional transistor is controlled by a constant-current source K. This constant-current source consists of a transistor $T_8$ which is operated with a common-emitter connection and the base potential of which is determined, for example by means of a voltage divider consisting of the resistor $R_1$ and the diodes $D_1$ and $D_2$ loaded in the forward direction. In addition, the transistor $T_8$ may comprise an emitter resistor $R_2$. The circuit operates as follows:

Even with a varying battery voltage, a relatively constant forward voltage, which determines the base potential of the transistor $T_8$, drops at the diodes $D_1$ and $D_2$, which may also be replaced by a single diode or by more than two diodes. Thus the direct collector current to the transistor $T_8$ and the base current of the additional transistor $T_7$ are also constant. This in turn leads to a constant direct collector current through the transistor $T_7$. $R = U_{CE}/I_C$ applies, however, for the direct-current resistance of the additional transistor $T_7$. A regulating circuit, not illustrated in the circuit shown in FIG. 1, ensures that half the battery voltage with respect to earth drops at the collector electrode of the transistor $T_3$. This voltage, only slightly reduced by the base-emitter voltage of the transistor $T_4$, also appears at the collector-emitter path of the transistor $T_1$ and, for reasons of symmetry, also at the collector-emitter path of the transistor $T_7$. Thus when the battery voltage drops, the collector-emitter voltage at the transistor $T_1$ and $T_7$ necessarily drops also in a corresponding manner. If the collector-emitter voltage at the transistor likewise drops as a result of a falling battery voltage, the resistance of the base-emitter path will also decrease in proportion to the variation in voltage. $I_{CT_1} = U_B - U/R$ with $U = U_{CET_1} + U_D$ applied, however, for the collector current through the driver transistor $T_1$, in which $U_D$ represents the sum of the voltages dropping at the diodes $D_3$ to $D_5$. From these equations, it will be seen that on a drop in the battery voltage, the resistance R must also become less in order that the direct current through the driver transistor may remain substantially constant. In the device according to the invention, this is achieved because the collector-emitter voltage at the transistor $T_7$ varies substantially in proportion to the battery voltage. The direct-current resistance in the collector section of the driver transistor is therefore controlled in the required manner. The direct collector current in the driver transistor and in the diodes $D_3$, $D_4$ and $D_5$, and hence also the direct collector current in the output-stage transistors, is thus dependent on the battery voltage.

Figure 2:
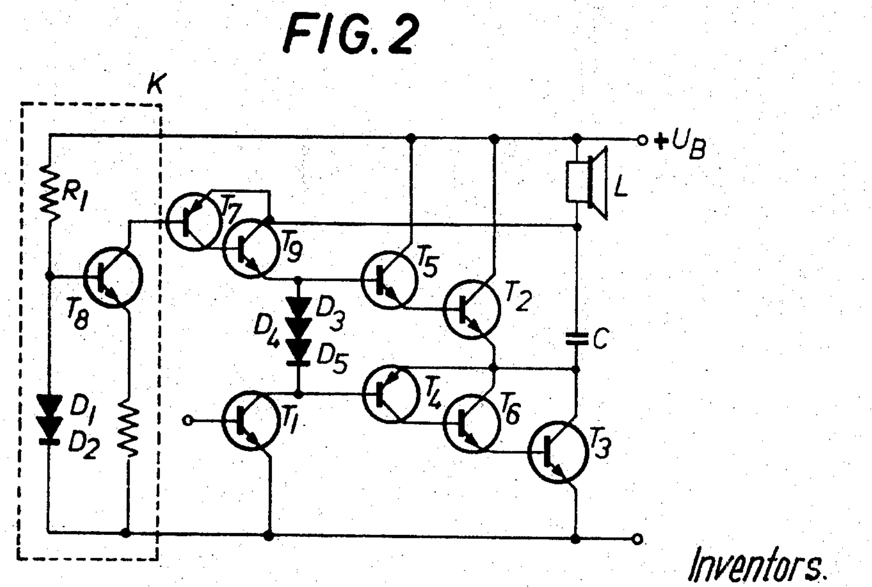
FIG. 2 is a circuit diagram similar to that shown in FIG. 1 but modified to provide a second embodiment of the invention.

The circuit shown in FIG. 2 shows a minor modification of the circuit shown in FIG. 1 which serves, in particular, to enable the circuit to be better integrated. The additional transistor $T_7$ shown in FIG. 1 is a p-n-p transistor which cannot be produced with the necessary current amplification by the integrated technique so that a relatively high power dissipation must be accepted in the transistor $T_8$ of the constant-current source. This disadvantage is eliminated in the circuit shown in FIG. 2 in that a p-n-p lateral transistor $T_7$ with the current amplification $B \approx 1$ is followed by an n-p-n transistor $T_9$ with a common-emitter connection for the current amplification. In this case, the emitter of the transistor $T_9$ is then connected, through the diodes $D_3$ to $D_5$, to the collector of the driver transistor $T_1$, while the collector of the transistor $T_9$ is connected to the emitter of the lateral transistor $T_7$.

In the circuits shown in FIGS. 1 and 2, a driver transistor is illustrated having the sequency of regions n-p-n. This transistor can also be replaced by a p-n-p transistor if the emitter electrode of this p-n-p driver transistor is then connected to the positive pole of the source of supply voltage and the other components of the circuit are adapted appropriately to this modification.

With the present invention, it is important that the load resistance of the driver transistor is formed by the collector-emitter path of a transistor in order to obtain a resistance varying in proportion to the battery voltage in this manner. The number of amplifier transistors between the driver stage and the output-stage transistors may be varied on the other hand.

It will be understood that the above description of the present invention is susceptible to various modifications changes and adaptations.

What is claimed is:

1. In an amplifier having a voltage supply source, a driver stage including a first transistor having an input signal applied thereto, a class-B push-pull output stage including second and third transistors having signal inputs, one of said signal inputs being coupled to the output electrode of said first transistor, means coupled between the signal inputs of said second and third transistors for maintaining the quiescent collector current of said second and third transistors independent of temperature fluctuations in said second and third transistor, and a fourth transistor, whose collector-emitter path forms a load resistance for said first transistor, connected in series with the collector-emitter path of said first transistor, the series connected collector-emitter paths of said first and fourth transistors being connected across said voltage supply source, and the other of said signal inputs of said second and third transistors being coupled to the electrode of the collector-emitter path of said forwith transistor which is connected to said output electrode of said first transistor, the improvement comprising a constant current source means, connected across said voltage supply source for supplying a constant current to the base electrode of said fourth transistor to control same so that the collector-emitter voltage of said fourth transistor and hence said load resistance of said first transistor varies substantially in proportion to the voltage of said voltage supply source, whereby the quiescent collector current in said second and third transistors is independent of fluctuations in the supply voltage.

2. An amplifier as defined in claim 1, wherein said second and third transistors are comprised of transistors having the same sequence of regions, and wherein said class-B push-pull stage further comprises a fifth transistor preceding one of said second and third transistors and complementary to said one of said second and third transistors for providing a phase reversal.

3. An amplifier as defined in claim 2, wherein said second and third transistors comprise n-p-n transistors, and said fifth transistor comprises a p-n-p lateral transistor.

4. An amplifier as defined in claim 3, wherein sixth and seventh transistors having common-emitter connections are connected respectively between said first transistor and said second and third transistors for current amplification.

5. An amplifier as defined in claim 4, wherein said means for maintaining said quiescent collector current in said second and third transistors comprises a plurality of diodes connected in the forward direction in parallel to the series-connection of the base-emitter paths of said sixth transistor, said second transistor and said fifth transistor.

6. An amplifier as defined in claim 3, wherein said fourth transistor comprises a p-n-p transistor, the emitter electrode of which is connected, through a load resistance L, to the positive pole of said voltage source.

7. An amplifier as defined in claim 6, wherein said fourth transistor comprises a lateral transistor and wherein said amplifier further comprises a further transistor with a common-emitter connection and complementary to and following said fourth transistor for current amplification.

8. An amplifier as defined in claim 1, wherein said constant-current source means comprises a transistor which is operated with a common-emitter connection, the collector electrode for said constant current source transistor being connected to the base electrode of the said fourth transistor, and a voltage divider, including the series connection of a resistor and at least one diode loaded in the forward direction, connected across said voltage supply source and having its output connected to the base electrode of said constant current source transistor for determining the base bias of said constant current source transistor by providing a constant voltage drop.

9. An amplifier as defined in claim 1, wherein at least said class-B push-pull output stage comprises an integrated unit in a common semiconductor body.

* * * * *

UNITED STATES PATENT OFFICE
CERTIFICATE OF CORRECTION

Patent No. 3,753,137 Dated August 14th, 1973

Inventor(s) Johann Mattfeld and Frank Pieper

It is certified that error appears in the above-identified patent and that said Letters Patent are hereby corrected as shown below:

In the heading of the patent, line 11, change "P 20 12 829.8" to --P 20 13 829.8--. Column 2, line 67, change "th" to --the--. Column 5, line 17, change "forwith" to -- fourth --.

Signed and sealed this 26th day of February 1974.

(SEAL)
Attest:

EDWARD M.FLETCHER,JR.
Attesting Officer

C. MARSHALL DANN
Commissioner of Patents